（12）United States Patent
Martemyanov et al.

(10) Patent No.: US 7,336,720 B2
(45) Date of Patent: Feb. 26, 2008

(54) REAL-TIME VIDEO CODING/DECODING

(75) Inventors: Alexey Martemyanov, St. Petersburg (RU); Nick Terterov, St. Petersburg (RU); Alexander Zheludkov, St. Petersburg (RU); Alexey Dolgoborodov, St. Petersburg (RU); Vladimir Semenyuk, St. Petersburg (RU); Eugene Neimark, St. Petersburg (RU); Irena Terterov, Palo Alto, CA (US)

(73) Assignee: Vanguard Software Solutions, Inc., Los Altos, CA (US)

( * ) Notice: Subject to any disclaimer, the term of this patent is extended or adjusted under 35 U.S.C. 154(b) by 838 days.

(21) Appl. No.: 10/672,195

(22) Filed: Sep. 26, 2003

(65) Prior Publication Data

US 2005/0276323 A1 Dec. 15, 2005

Related U.S. Application Data

(60) Provisional application No. 60/477,814, filed on Jun. 12, 2003, provisional application No. 60/414,275, filed on Sep. 27, 2002.

(51) Int. Cl.
H04B 1/66 (2006.01)
(52) U.S. Cl. .................................. 375/270.12
(58) Field of Classification Search ........... 375/240.12, 375/240.13, 240.14, 240.05, 240.16, 240.15; 382/282, 243, 236
See application file for complete search history.

(56) References Cited

U.S. PATENT DOCUMENTS 5,640,208 A  6/1997  Fujinami
5,778,190 A  7/1998  Agarwal
5,796,435 A  8/1998  Nonomura et al.
5,812,788 A  9/1998  Agarwal
6,044,115 A * 3/2000  Horiike et al. ......... 375/240.05

(Continued)

OTHER PUBLICATIONS

M. Schindler, A Fast Renormalisation for Arithmetic Coding, Proc. Data Compression Conference, Mar. 30-Apr. 1, 1998, p. 572, Snowbird, Utah, U.S.A.

(Continued)

*Primary Examiner*—Tung Vo
(74) *Attorney, Agent, or Firm*—Fitch, Even, Tabin & Flannery

(57) ABSTRACT

A video codec for real-time encoding/decoding of digitized video data with high compression efficiency, comprising a frame encoder receiving input frame pixels; a codec setting unit for setting and storing coding setting parameters; a CPU load controller for controlling desired frame encoding time and CPU loading; a rate controller for controlling frame size; a coding statistics memory for storing frequency tables for arithmetic coding of bitstream parameters and a reference frame buffer for storing reference frames. The frame encoder comprises a motion estimation unit, a frame head coding unit, a coded frame reconstruction and storage unit and a macroblock encoding unit. The macroblock encoding unit provides calculation of texture prediction and prediction error, transforming texture prediction error and quantization of transform coefficient, calculation of motion vector prediction and prediction error and arithmetic context modeling for motion vectors, header parameters and transform coefficients. The codec also includes a deblocking unit for processing video data to eliminate blocking effect from restored data encoded at high distortion level, which may be a part of encoder or decoder, an internal resize unit, providing matching downscaling of a frame before encoding and upscaling of decoded frame according to the coding setting parameters, and a noise suppression unit.

24 Claims, 5 Drawing Sheets

U.S. PATENT DOCUMENTS

| | | | |
|---|---|---|---|
| 6,055,330 A * | 4/2000 | Eleftheriadis et al. ...... 382/154 |
| 6,081,554 A * | 6/2000 | Lee et al. ................... 375/240 |
| 6,091,777 A | 7/2000 | Guetz et al. |
| 6,233,278 B1 | 5/2001 | Dieterich |
| 6,263,020 B1 | 7/2001 | Gardos et al. |
| 6,317,520 B1 | 11/2001 | Passaggio et al. |
| 6,434,196 B1 * | 8/2002 | Sethuraman et al. ... 375/240.12 |
| 6,438,168 B2 | 8/2002 | Arye |
| 6,445,828 B1 | 9/2002 | Yim |
| 6,483,505 B1 | 11/2002 | Morein et al. |
| 6,496,607 B1 * | 12/2002 | Krishnamurthy et al. ... 382/282 |
| 6,594,395 B1 * | 7/2003 | Forchheimer et al. ...... 382/236 |
| 6,597,739 B1 * | 7/2003 | Li et al. ................. 375/240.19 |
| 6,683,992 B2 * | 1/2004 | Takahashi et al. .......... 382/243 |
| 6,909,810 B2 * | 6/2005 | Maeda ....................... 382/243 |
| 6,965,643 B1 * | 11/2005 | Maeda et al. .......... 375/240.12 |
| 7,110,459 B2 * | 9/2006 | Srinivasan ............. 375/240.29 |
| 2002/0061138 A1 | 5/2002 | Uenoyama et al. |

OTHER PUBLICATIONS

G. N. N. Martin, Range encoding: an algorithm for removing redundancy from a digitized message, IBM UK Scientific Center (paper presented in Mar. 1979 to the Video & Data Recording Conference held in Southampton July 24-27).

John Watkinson, The Engineer's Guide to Compression, 1996, pp. 62-72, Snell & Wilcox Ltd., Sunnyvale, California, U.S.A.

International Search Report for PCT/US03/30515 of Feb. 25, 2004.

* cited by examiner

▲ coefficient being encoded
○ coefficient used for context formation

- neighbor coefficients;

C – current coefficient;

- root coefficient (coefficient from previous wavelet-resolution level).

REAL-TIME VIDEO CODING/DECODING

This application claims priority to U.S. provisional applications Nos. 60/414,275, filed Sep. 27, 2002, and 60/477,814 filed Jun. 12, 2003, incorporated herein by reference in its entirety.

This application relates to video codec (coder/decoder) systems used preferably for broadcast applications, such as news cameras or studio video manipulation equipment, or as a part of a computer system, which involves real-time or close to real-time video compression and transfer: video conferencing systems, internet video translation systems, video security and surveillance systems, etc.

BACKGROUND OF THE INVENTION

Video codecs are employed to convert initial video sequence (a set of video images, also named pictures, or frames) into encoded bitstream (a set of compressed video sequence binary data), and also converting video sequence binary data produced by a video codec system into a reconstructed video sequence (a decoded set of video images, or reconstructed frames). Hereinafter, the terms "frame" and "picture" are assumed to be identical. It is known that video compression relies on two basic assumptions. The first is that human sensitivity to noise in the picture (frame) is highly dependent on the frequency of the noise. The second is that in a picture sequence every picture has a lot in common with the preceding picture. In a picture large objects result in low spatial frequencies, whereas small objects result in high spatial frequencies. The noise detected by human vision is mostly at low spatial frequencies. The data may be compressed by sending only the difference between one picture and the next, and raising the noise where it cannot be detected, thus shortening the length of data words. Video sequence contains a significant amount of statistical and subjective redundancy within and between pictures that can be reduced by data compression technique to make its size smaller. For still pictures (as in JPEG format), an intra-frame or spatial redundancy is used, which treats each picture individually, without reference to any other picture. In intra-coding the main step is to perform a spatial frequency analyses of the image, using a known technique of Discrete Cosine Transform (DCT). DCT converts input pixels into a form in which the redundancy can be identified. The frame is broken up into rectangular areas called macroblocks and converted a macroblock block at a time. A typical two-dimensional 2D-block is 8×8 pixels. The 2D-DCT converts the block into a block of 64 coefficients. A coefficient is a number which describes the amount of a particular spatial frequency which is present. The coefficients then zig-zag scanned, weighted and run-length coded.

For moving pictures, the mode of inter-coding is known to be used to exploit redundancy between pictures, which gives a higher compression factor than the intra-coding. The "difference" picture is produced by subtracting every pixel in one picture from a pixel in the same position in the next picture. The difference picture may be then compressed using intra-coding with DCT.

In the case of significant movement between the pictures resulting in large differences, it is known to use motion compensation (MC), which allows a higher compression factor. According to the known MC technique, at the coder, successive pictures are compared and the shift of an area from one picture to the next is measured to produce motion vectors. The codec attempts to model the object in the new picture from the previous picture using motion vectors. Each macroblock has its own motion vector which applies to the whole block. The vectors from the previous picture is coded and vector differences are sent. Any discrepancies are eliminated by comparing the model with the actual picture. The codec sends the motion vectors and the discrepancies. The decoder does the inverse process shifting the previous picture by the vectors and adding the discrepancies to produce the next picture. The quality of a reconstructed video sequence is measured as a total deviation of it's pixels from the initial video sequence. The increased use of real-time digital video communication applications, such as video conferencing and video telephony presents an ever increasing demand in high video quality.

In view of the increasing use of real-time and close to real time video compression and arrival of a new standard improving quality of the real time video communication, there is a need for new effective algorithms applicable to different types of video codecs, which can be used in the video encoders complying with ITU-T Recommendation H.264, also known as MPEG-4 Part 10, or AVC (ISO/IEC 14496-100), etc.

Most of known block-based video coding systems such as MPEG-4 or ITU-T H.264, use coding algorithms with the common steps of dividing each video frame into blocks of pixels (pels); predicting the block pixels using "inter" prediction, or "intra" prediction technique; transforming texture prediction error blocks and providing quantization of the transform coefficients; predicting the motion vectors and calculating the motion vector prediction differences; and coding texture prediction error quantized transform coefficients, motion vectors prediction differences, intra prediction types and the auxiliary frame data.

In most encoders, which deal with different motion compensation block sizes, a separate motion estimation procedure is used for each block size. This increases the complexity of the motion estimation algorithm and could present a problem in providing efficient interconnections between the motion vectors used in texture blocks of different sizes.

The new H.264 Standard improved the accuracy of motion vector calculation using a quarter-pel-accurate motion compensation form. However, during motion estimation and motion compensation a quite complicated interpolation procedure is needed for calculating the pixel values with non-integer coordinates. In order to provide an adequate motion estimation using known methods, it is necessary either to store in memory a 4-times-zoomed frame, or to perform a non-integer pixel interpolation during the motion estimation. Both methods have their disadvantages. In the first case a memory storage required for reference frames is increased by 16 times. The second method increases the algorithm computational complexity and leads to an additional CPU load.

Thus, there is a need for new methods and algorithms, which reduce the computational complexity of the motion estimation without significant CPU load and employment of additional memory, as well as need for new common motion estimation methods sufficiently improving interconnections of motion vectors for blocks of different size.

An object of the proposed video coding/decoding method is:

to increase quality of a reconstructed video sequence at a given size of compressed video sequence binary data; and to reduce size of compressed video sequence binary data at a given quality of a reconstructed video sequence.

An object of the proposed codec is to provide real-time encoding/decoding of video data on a PC platform without an acceleration board.

SUMMARY OF THE INVENTION

To provide encoding/decoding of digitized video data with high compression efficiency, a codec of the present application is proposed, comprising a frame encoder receiving input frame pixels; a codec setting unit for setting and storing coding setting parameters; a CPU load controller for controlling desired frame encoding time and CPU loading; a rate controller for controlling size of the frame encoder output bitstream; and a coding statistics memory for storing frequency tables for arithmetic coding of bitstream parameters and a reference frame buffer for storing reference frames. Depending on desired reconstructed sequence quality and bitrate parameters, the video mode may be switched from advanced motion compensation mode to low complexity three-dimensional (3-D) frame encoding in lack of system resources. The codec may include a deblocking unit for processing video data to eliminate blocking effect from restored data encoded at high distortion level, which may be a part of encoder or decoder, an internal resize unit, providing matching downscaling of a frame before encoding and upscaling of decoded frame according to the coding setting parameters, and a noise suppression unit. The motion compensation encoder comprises a motion estimation unit, a frame header coding unit, a macroblock encoding unit and a coded frame reconstruction and storage unit. The macroblock encoding unit comprises an intra prediction mode unit, at least one inter prediction mode unit, a macroblock header controller selecting macroblock type and encoding setting and an entropy encoding unit providing arithmetic context modeling for motion vectors, header parameters and transform coefficients. The macroblock encoding unit provides calculation of texture prediction and prediction error, transforming texture prediction error and quantization of transform coefficient, calculation of motion vector prediction and prediction error. The decoding part of the codec is corresponding to the encoding part and comprises an arithmetic context-based decoding unit using arithmetic decoding modeling corresponding to arithmetic encoding modeling of the codec, a 3-D inverse transform and dequantization unit, a motion vector reconstruction unit, a transform coefficient inverse quantization unit, a texture prediction inverse transform unit, a reconstructed macroblock texture unit.

The method of encoding a digitized sequence of video frames using the above codec with high compression efficiency, comprises steps of dividing a video frame into macroblocks of pixels; performing texture prediction using reconstructed texture of previously encoded/decoded video data; performing texture prediction error transform; and performing quantization and encoding of DCT transform coefficients.

The method of encoding also includes controlling parameters of encoded frames, frame encoding time and CPU load. The best parameters and encoding mode for macroblock coding is selected based on preset coding parameters and codec working parameters. The method may include a matched scaling algorithm to accelerate the encoding/decoding, providing downscaling before encoding of the video frame and upscaling of the frame to restore its original size after decoding, and a noise suppression algorithm. The encoding mode is selected between a low-complexity 3-dimensional data coding and motion compensation. The motion compensation starts with choosing a best prediction mode between inter prediction and intra prediction. The wavelet transform is used in the preferred embodiment and the resulting wavelet transform coefficients are compressed by context-based entropy coding and quantization with constant step size is applied to all wavelet transform coefficients. The motion estimation of the motion vector components is performed with quarter-pel accuracy and encoding of the vector prediction difference is performed by arithmetic context modeling. The encoding of DCT transform coefficients is performed by arithmetic coding based on two-dimensional contest/position-depending modeling. The decoding stage includes steps of arithmetic decoding of coded block pattern of macroblock mode and texture using arithmetic context-based modeling, calculating prediction for motion vectors; and decoding motion vectors using context-based arithmetic modeling; decoding texture prediction error using arithmetic context-based modeling; inverse transform and dequantization of texture prediction error correlated with corresponding encoding procedures; and deblocking of decoded video frame using at least one of horizontal and vertical deblocking passes for smoothing of sequence of video frame border points.

DESCRIPTION OF PREFERRED EMBODIMENTS

The proposed codec is designed to transform an input video sequence into a compressed bitstream, so that the video sequence can be restored from the bitstream. It can function in two modes, a 3-D coding and motion compensation, and to provide the lowest possible bitrate at a given reconstructed sequence quality, or to provide the best possible quality at a given bitrate. In order to guarantee a continuous video transmission and to perform coding with no less than a given framerate, the encoder may switch from high efficiency motion compensation mode to a low complexity 3D-encoding algorithm.

The encoder supports up to two layers of scalability: the base layer that should be decoded to get the reconstructed sequence, and the enhanced layer that, in conjunction with the base layer, results in better video sequence quality. This allows the decoder to skip the decoding of the enhanced layer when it is necessary to preserve the real-time performance in lack of system resources, or when the base layer quality is sufficient. The codec allows to process video data on a PC platform without an acceleration board using the proposed algorithms. It also may be used on a Digital Signal Processor (DSP) platform, or implemented in a chip on various silicon platforms. Moreover, it may be based on any combination of the above platforms.

Figure 1:
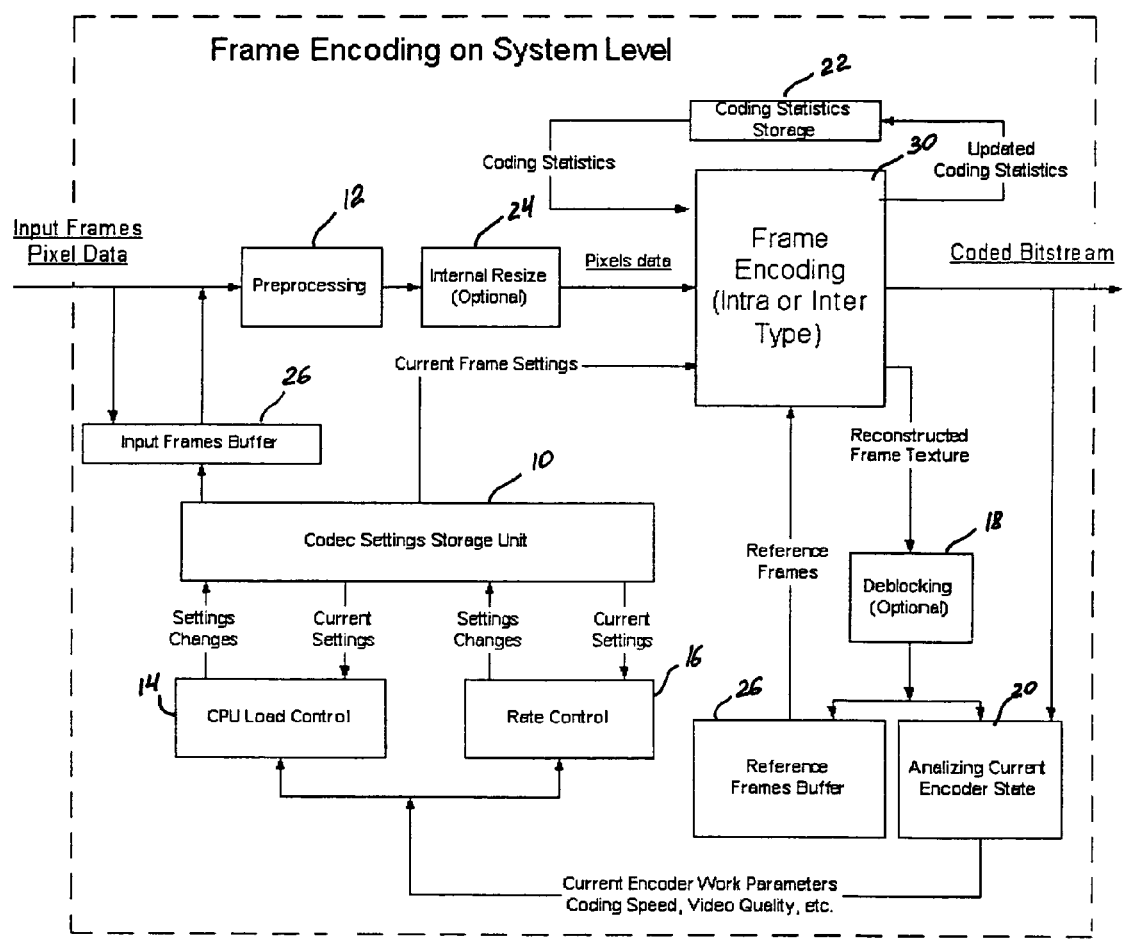
FIG. 1 shows a block-diagram of frame encoding on system level.

The frame (picture) encoding on a system level is shown in FIG. 1. The encoder comprises Codec Settings Storage Unit 10, which is used for storage of the codec setting parameters received from the processor and may be corrected based on the current encoder work parameters, such as coding speed, video quality, etc. In particular, these setting parameters include: inter frame quant parameter; wavelet image quality parameter; initial frame width; initial frame height; final input frame width; final input frame height; desired time of the frame encoding; desired size of coded frame; independently coded group size; frame encoding mode; maximal number of the reference frames; number of the reference frames for the current frame; motion estimation search range; allowed macroblock subdivision modes; allowed intra prediction modes, etc. A frame consists of three rectangular matrices of 8-bit numbers representing the luminance and two chrominance signals. The CPU Load Controller 14 controls the desired frame encoding time and CPU loading. Based on the current frame coding time, CPU load and the coding settings, the CPU load controller 14 changes the following parameters of the coding settings for the next frames to fit the desired frame encoding time and the CPU load: the frame encoding mode, the maximal number of the reference frames, the motion estimation search range, the allowed macroblock subdivision modes, the allowed intra prediction modes. The Rate Controller 16 controls the size of the frame encoder output bitstream. It changes the inter frame quant parameter and the wavelet image quality parameter to fit the desired size of the coded frame based on the current coded frame size, and current coding settings. It also uses internal information about frames and macroblocks parameters and take into account quantization level/frame size dependence. The Deblocking Unit 18 provides the image processing for eliminating the blocking effect from restored image encoded at high distortion level. The actual purpose of the deblocking is smoothing near the block borders that results not only in better visual quality, but also in better peak signal-to-noise ratio (PSNR). It may be used in the encoder and/or in the decoder. The Current Encoder State Analizer 20 calculates the frame encoding time and the reconstructed picture quality, and also the CPU load for a currently encoded frame. The Coding Statistics Storage Unit 22 contains a set of frequency tables corresponding to arithmetic coding of the bitstream parameters. Several tables may correspond to one arithmetically coded parameter according to so called coding contexts. Usually the table is updated after encoding/decoding of the given parameter with given context. The update, in turn, is necessary for the next encoding/decoding of this parameter. All the bitstream parameters except sequence headers, frame headers, stream headers and start codes are coded arithmetically. The Internal Resize Unit 24 provides zoom-in of the internal picture before encoding and zoom-out after decoding, which is performed according to the coding setting parameters including initial picture width, initial picture height, final input picture width, final input picture height. The Reference Frames Buffer 26 is used for storing reference frames. The number of the reference frames is defined by the corresponding parameter in the coding settings.

The frame encoding is provided as follows. The input frame pixels are processed according to the initial codec settings. In one embodiment, the codec provides compression of an input video sequence in row YUV 4:2:0 format, in which every 4×4 block of pixels of the Y-component plane corresponds to 2 pixels of the U-component plane. First, a preprocessing procedure including noise reduction, user defined resizing, some image corrections for better coding, etc. is performed in the preprocessing unit 12. Than, if the "internal scaling" flag is enabled in the codec setting unit 10, the internal resize is performed by unit 24 over the initial frame. This produces final input pixel data.

Figure 2:
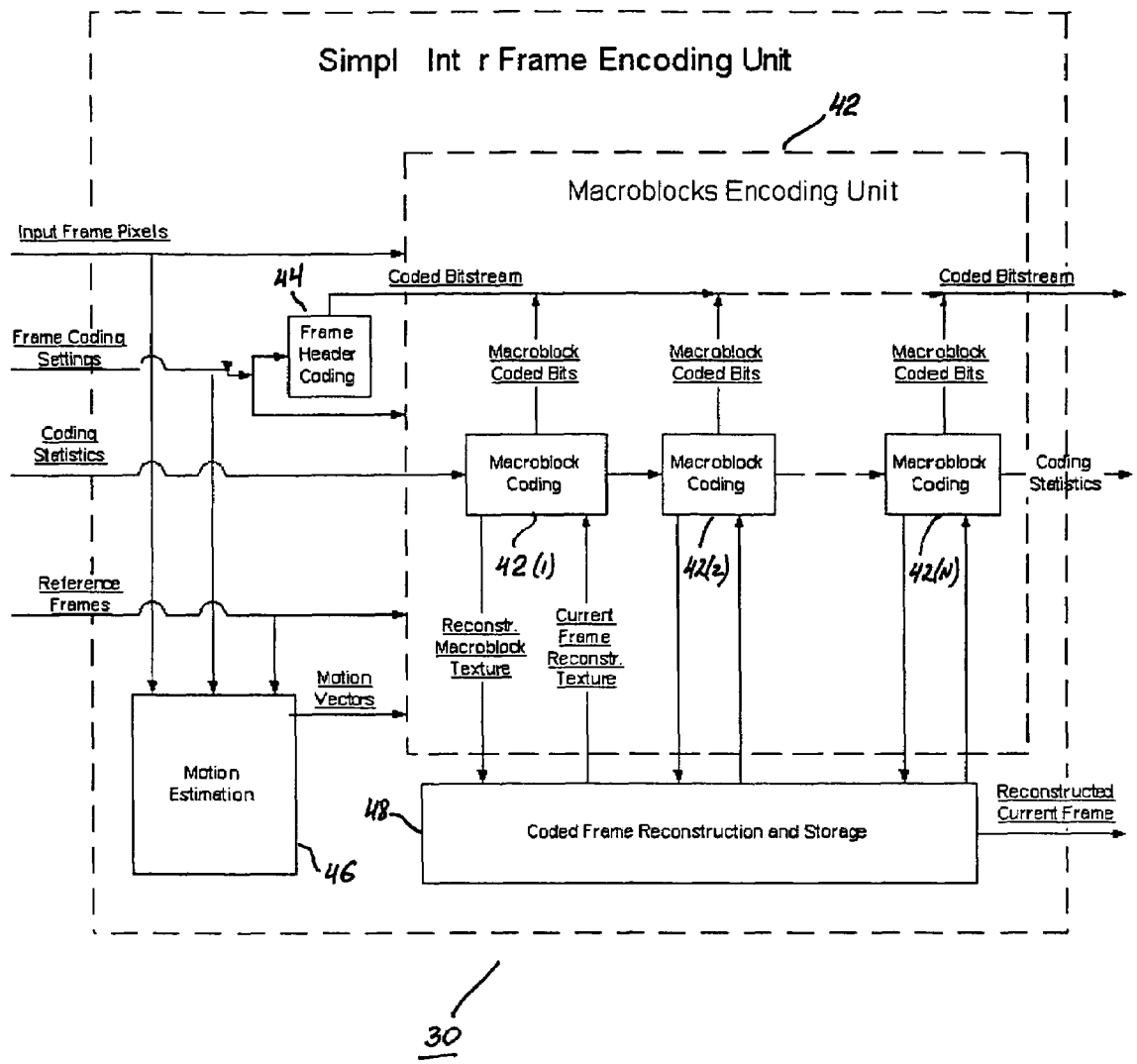
FIG. 2 shows a block-diagram of a simple inter frame encoding unit.

The Frame Level Encoder 30, diagram of which is shown in FIG. 2, receives the input frame pixels from unit 24, the current frame coding settings from unit 10, coding statistics from unit 22, and the reference frame parameters from the reference frame buffer 26 as an input. First, frame header parameters, including frame type, frame width and height, information about reference frames and the other frame related stuff is coded. The set of parameters is defined by the requirements that it should be sufficient for further proper decoding. According to the frame setting, a motion estimation procedure is performed for the current frame and all the reference frames. Motion estimation unit 46 provides the motion vectors needed for the current frame texture prediction. After the motion estimation, the macroblock coding procedure is performed for each frame macroblock. This coding procedure for each macroblock provides reconstructed macroblock texture and coded bitstream, and also updates the coding statistics. Besides the reference frame, the macroblock coding utilizes the reconstructed texture of the previously coded macroblocks. When the macroblock coding procedure is done for all macroblocks, the output of the frame level encoding unit 30 comprises the reconstructed frame pixels, the coded bitstream and the updated coding statistics. The reconstructed frame pixels are stored in the reference frame buffer 26, according to the codec settings, and the updated coding statistics is stored in unit 22. A deblocking procedure may be performed over the stored reconstructed frame picture in unit 18 before using it as a reference.

After the frame encoding, the following characteristics of the encoding process are measured in the current encoder state analizer 20: the reconstructed picture quality, the frame encoding time and the coded bitstream size.

These characteristics and the current frame settings are used in the rate controller 16 and the CPU Load Controller 14 to make the necessary changes in the codec settings for the next frame encoding.

The frame level encoder 30 may work in intra or inter mode. It also updates the entropy coding statistics, which is stored in the coding statistics storage unit 22.

The preprocessing stage provided by unit 12 and the postprocessing (deblocking) stage provided by unit 18 are optional. If the preprocessing is on, the input pictures are filtered to get a higher compression ratio and a better reconstructed sequence quality. If postprocessing is on, a deblocking filter is applied to the reconstructed pictures to remove the blocking effect.

According to the present method, a video sequence is broken into groups of still images (pictures). These groups, named Independent Groups (IG) are coded independently, i.e. all information required for decoding the Independent Group is contained in the corresponding part of the bitstream. The maximum allowed size of an Independent Group could be set up to catch the compromise between the coding efficiency and the possibility of direct access to the pictures, since the decoding process can start only from the first picture in a group. The Scene Change Detection (SCD) algorithm implemented in the encoder can reduce the size of an Independent Group when it results in better compression.

The proposed encoder is designed to function in two modes: advanced Motion Compensation (MC) coding and low-complexity three-dimensional (3D) data coding. The Motion Compensation mode is described first.

In the Motion Compensation (MC) mode, the first picture in the independent group is intra-coded, others can be intra or inter-coded, i.e. coded using the information from the previous pictures in the IG.

In the MC intra mode, a picture is broken into 16×16 macroblocks, which in turn may be broken into 16×16 or 4×4 blocks (the fragmentation can be different for different macroblocks of a picture). The macroblocks are coded sequentially row-by-row left to right. The blocks of each macroblock are coded in the same order. The pixel values for each block may be predicted from the already coded blocks by using several prediction schemes. A known technique of Discrete Cosine Transform (DCT) is applied to every texture prediction error block. The texture difference from the prediction is transformed into frequency domain with two-dimensional DCT (2D-DCT) transform. The transform coefficients are quantized, reordered, coded and then coded arithmetically.

In the MC inter mode, the picture is also broken into 16×16 macroblocks. Each macroblock can be intra or inter coded. The intra coding is identical to that described above. For inter coding, a macroblock is broken into 16×16, 8×8, 16×8, 8×16, 4×8, 8×4 or 4×4 blocks. For each block, a motion vector to one of the reference frames is transmitted that provides the best prediction of the block pixels in block match. The texture difference from the prediction is coded as in the intra mode.

The IG, the 8-picture groups in 3D mode, and the pictures in MC mode all start with startcodes that are 24-bit sequences (ascii "STC") followed by an 8-bit start code value. All startcodes are byte-aligned. The startcode values are used to identify the type of the object that starts with the startcode. The main advantage of using the startcode is that it provides error recovery and direct access to the bitstream: the decoder which tracks the bitstream can start decoding whenever it finds an IG startcode.

There is also a so-called "rendering group" startcode that is sent to the bitstream to notify the decoder that there is no dependency between the frames processed and the frames to be coded. Normally, this startcode is sent after each picture in MC mode or after an 8-picture group in 3D mode, but in the presence of B-frames it is sent only before I-frames or P-frames.

FIG. 2 schematically presents a Simple Inter Frame Encoding Unit 30. The encoding unit 30 includes a Macroblock Encoding unit 42, which is a frame texture coding unit corresponding to 16×16 frame texture blocks; a Frame Header Coding unit 44, which includes a set of parameters for proper frame decoding. Encoding of these parameters does not involve arithmetic coding, each parameter is coded as an integer number with a minimal necessary number of bits according to the range of the parameter value. The encoding unit 30 also includes a Motion Estimator 46, which performs motion estimation procedures. First, the picture area is divided into blocks of size M×N. For each block whose left-top corner is located in (x_init,y_init) point of the image, wherein x_init is the multiple of M and y_init is the multiple of N, a two-dimensional shift value (x_shift, y_shift) is calculated, so that M block on the reference frame whose left-top corner is located in the point (x_init+x_shift, y_init+y_shift) is the prediction. The Coded Frame Reconstruction and Storage unit 48 provides the intra macroblock texture prediction and/or inter macroblock texture prediction.

The Intra macroblock texture prediction is the prediction for the current macroblock texture, which involves only reconstructed texture of the previously coded macroblocks from the same frame.

The Inter macroblock texture prediction is the prediction for the current macroblock texture, which involves the reconstructed texture of the previously coded frames. The frame is called inter frame if it contains inter predicted macroblocks.

The Intra prediction mode includes 8 different algorithms, which are used for the intra macroblock texture prediction.

In the Inter prediction mode the macroblock area is divided into 8 subdivisions, which are 8 rectangular blocks with width and height either 8 or 16, each rectangular block having a corresponding separate motion vector which is used for the intra prediction.

Figure 3:
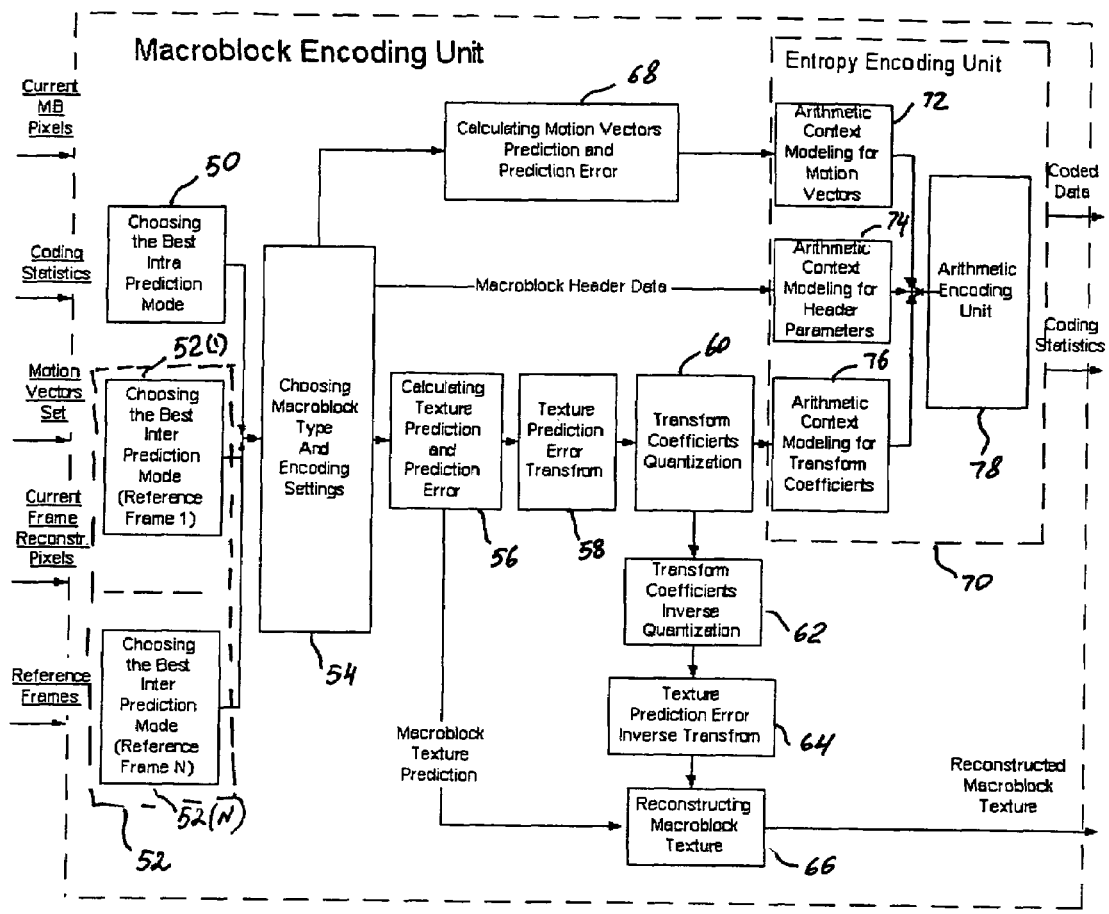
FIG. 3 shows a macroblock encoding unit.

The diagram of macroblock encoding is shown in FIG. 3. It starts with choosing the best inter and intra prediction mode on steps 50 and 52.

Consider $E_{jO}, E_{jl}, \ldots, E^{jk}$-two-dimensional 16×16 arrays of macroblock texture prediction errors for all allowed macroblock inter prediction modes. Let $H(E_{jO})$, $H(E_{jl}), \ldots, H(E_{jk})$ be the results of Hadamard Transform (which are also 16×16 two-dimensional arrays) of these texture prediction errors. Denote that S(B) is the sum of the absolute values of two-dimensional array of B elements. Let the macroblock has K independent motion compensated blocks. Denote motion vector components of the 1-st block as (MvX(l), MvY(l)). Quantitative characteristics of the inter prediction mode is calculated according to the formula:

$$Q_{jk} = S(H(E_{jk})) + \lambda x \left( \sum_{l=0}^{K-1} (\log_2 |MvX| + \log_2 |MvY|) \right).$$

The Inter prediction mode jk that has the lowest characteristics is being chosen as the best inter prediction mode for the given macroblock and reference frame. The quantitative characteristics for the Intra prediction mode are calculated in a similar way: $Q_{jk}=S(H(E_{jk}))$. The lower is the value of $Q_{jk}$, the better is the intra prediction mode.

After the prediction mode is chosen in units 50 and 52, and the macroblock type and the reference frame in unit 54, respectively, the macroblock texture prediction and prediction error are calculated in unit 56, as follows.

Suppose that inter prediction mode and the reference frame are defined in unit 52. According to the inter prediction mode index, the macroblock area is divided into independent motion compensated blocks. For each of these blocks the inter texture prediction is calculated as follows. Let this motion compensated block of size M×N has its left-top corner in the point (x_init,y_init) of the image. Let (x_shift, y_shift) be the motion vector corresponding to this block. Then, the M×N block on the reference frame whose left-top corner is located in the point (x_init+x_shift, y_init+y_shift) is chosen as texture prediction for this block. Performing the motion compensation procedure for all motion compensated blocks of the macroblock, we obtain texture prediction for the whole 16×16 macroblock texture area. The inter prediction error is calculated as a two-dimensional 16×16 array of current macroblock pixel deviations from macroblock texture prediction.

A known technique of Discrete Cosine Transform (DCT) is applied to every texture prediction error block in unit 58 and the resulting DCT coefficients are being quantized in unit 60. The reconstructed DCT coefficients may be obtained by inverse quantization procedure in unit 62. Applying inverse DCT to the reconstructed coefficients in unit 64, the reconstructed macroblock texture is calculated in unit 66 as sum of the texture prediction received from unit 56 and the reconstructed prediction error from unit 64.

The object of the entropy encoding unit 70 is to identify and send the useful part of the input signal known as entropy. The remaining part of the input signal is called the redundancy. For minimizing the motion vectors spatial redundancy, their components are also predicted in unit 68 from motion vectors of the neighboring blocks.

Thus, three groups of parameters are encoded in the entropy encoding unit 70:

quantized DCT coefficients,
motion vector components prediction error; and
macroblock header parameters.

A separate context modeling procedure is performed for each of these parameters in units 72, 74 and 76. After choosing proper contexts, the parameters are arithmetically encoded in unit 78.

Bitstream Syntax Elements

The bitstream syntax description is the basic reference section for building encoder and decoder modules used in the proposed system. The formal syntax description uses chains of syntax elements presented as tables. The table left column presents syntax elements and branching, the right column describes the syntax element (SE) representation. The notations used in SE representation description are as follows:

A decimal number means that the binary representation is used for the syntax element and shows the number of bits used. In IG and picture headers, bits are sent to bitstream directly, in other cases bits are coded using arithmetic encoder with 2-symbol non-adaptive model (frequencies for 0 and 1 are 0.5).

AC means that a symbol is coded with (adaptive) arithmetic model. A number in braces presents the arithmetic model size (number of symbols).

xN means that symbol is repeated N times.

Symbols in bold are syntax 'atoms' that are coded to the bitstream. That in regular font are actually groups of symbols (such as picture) that are described in separate Tables 1-3.

TABLE 1

| Bitstream | |
|---|---|
| Independent Group | Repeated unlimited number of times |

TABLE 2

| Independent Group | |
|---|---|
| IG_header | |
| Rendering_group | Repeated unlimited number of times |

TABLE 3

| Rendering_group |  |
|---|---|
| if (IG_header.b_3Dcoding) { | |
| 3D_group | |

TABLE 3-continued

| Rendering_group | |
|---|---|
| } else { | |
| picture | |
| } | |
| StartCodePrefix | 24 |
| StartCodeValue | 8 |

Independent Group Header

The IG header contains information concerning video sequence geometry (picture resolution), framerate, scaleType, coding mode (3D or ME), number of layers, deblocking parameter, scaling type, motion estimation type. The IG header starts with startcode followed by startcode value 0x01 followed by abovementioned bitstream parameters.

TABLE 4

| IG_header | |
|---|---|
| StartCode | 24 |
| StartCodeValue | 8 |
| FrameWidth | 12 |
| FrameHeight | 12 |
| ScaleType | 3 |
| b_3Dcoding | 1 |
| if (b_3Dcoding) { | |
| b_UseWavelets | |
| } | |
| else { | |
| RenderingGroupSize | 8 |
| RefBufferingSize | 8 |
| BaseLayer.MaxRefNum | 4 |
| EnhLayer.MaxRefNum | 4 |
| } | |
| BaseLayer.NumGroup | 4 |
| EnhLayer.NumGroup | 4 |
| DeblockingParameter | 5 |
| ScaleFactor | 8 |
| bMVsZero | 1 |
| bMVsZeroInterlace | 1 | wherein the IG header parameters are as follow:

FrameWidth—input picture horizontal resolution;

FrameHeight—input picture vertical resolution;

ScaleType—enum value that determines downscaling of input pictures prior to coding.

0=no downscaling, 1=downscaling to 75% (each dimension), 2=downscaling to 50%;

b_3Dcoding—if 1, 3D coding mode is used, otherwise the coding is in MC mode;

b_UseWavelets—if 1, the DC plane of temporal DCT transform is wavelet-coded, otherwise all planes are coded with 2D-DCT transform;

RenderingGroupSize—number of pictures that should be decoded prior to being endered;

RefBufferingSize—allowed number of reference frames that should be stored in decoder memory;

BaseLayer.MaxRefNum—maximum number of reference frames that can be used in the base layer;

EnhLayer.MaxRefNum—maximum number of reference frames that can be used in the enhanced layer;

BaseLayer.NumGroup—number of pictures of base layer coded continuously (not alternated with enhanced layer pictures);

EnhLayer.NumGroup—number of pictures of enhanced layer coded continuously (not alternated with base layer pictures);

DeblockingParameter—number that characterizes strength of the deblocking filter;

ScaleFactor—is not used;

bMVsZero—if 1, motion vectors are not transmitted and always have value (0,0) for all frames;

bMVsZeroInterlace—if 1, motion vectors are not transmitted and always have value (0,0) for even frames.

Frame

The frame (or picture) is divided into 16×16 macroblocks that are coded row-by-row, left-to-right. The frame is represented as a frame header that describes frame coding details, and frame data that is different for intra and inter frames.

The frame header is coded directly and starts with startcode followed by startcode value 0x02 followed by frame coding details.

TABLE 5

| Frame_Header | |
|---|---|
| StartCodePrefix | 24 |
| StartCodeValue | 8 |
| Time | 8 |
| PredType | 2 |
| if (PredType = INTRA) { | |
|     QuantStep | 7 |
|     bPotentialRef | 1 |
| } else { | |
|     QuantStep | 5 |
|     bPotentialRef | 1 |
|     Nrefs | 2 |
|     nRefOffset | 4 × nRefs |
|     bSubdivModeEnable | 1 × 7 |
|     bMVsZero | 1 |
| } | |
| bIsCoded | 1 |

The Frame Header parameters are as follow:

Time—the display time of the frame in the independent group;

PredType—enum value that determines frame type: 0=I, 1=P, 2=B;

QuantStep—quantization parameter;

bPotentialRef—if 1, frame can be referenced from other frames, otherwise it can be purged after being rendered;

Nrefs—number of frames to which the current frame is referenced;

NRefOffset—distance (timestamp delta) from the current frame to each reference frame;

bSubdivModeEnable—if 0, the corresponding macroblock subdivision mode is disabled for this frame. The subdivision modes are ordered as follows: 16×16, 8×16, 16×8, 8×8, 4×8, 8×4, 4×4.

bMVsZero—if 1, the motion data is not coded and all motion vectors are considered to be (0,0).

The frame data may be represented as intra data or inter data.

Intra Frame Data

In the present encoding method, in addition to using wavelet transform for image decomposition, the resulting wavelet transform coefficients are compressed by entropy coding.

The wavelet-based image compression algorithm of the present application can be summarized as follows:

calculating wavelet transform for the whole image by using, for example, bi-orthogonal 9-7 filter, same as for JPEG2000 irreversible wavelet transform;

applying a uniform quantization [0] with a constant step size to all coefficients, as described below;

initializing all entropy coders to a uniform distribution; and sending each wavelet coefficient by using context-based entropy coding.

Figure 6:
FIG. 6 shows a context-based entropy coding of coefficients.
Figure 6:
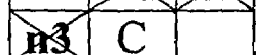
Figure 6:

The context modeling and entropy coding of the wavelet transform coefficients is illustrated by FIG. 6 and will be described later.

Inter Frame Data

Inter-coded frames are divided into 16×16 macroblocks that are coded row-by-row, left-to-right. All data is coded with arithmetic encoder. The macroblock starts with macroblock header that describes macroblock coding details (macroblock type, subdivision mode, presence of texture data etc.) followed by motion vector data (if present) and texture data (if present). For the inter coding, the block-match motion compensation from up to 2 reference frames is used. All the parameters in the bitstream except the stream header, the IG headers and the frame headers are coded arithmetically, mostly using context-dependent models. The header parameters are transmitted in direct binary representation.

TABLE 6

| Macroblock header | |
|---|---|
| if (frame.bMVsZero == 0) { | |
|   bSkip | AC(2) |
|   if (bSkip) { | |
|     MvType | AC(2) |
|   } else { | |
|     bIsIntra | AC(2) |
|     if (bIsIntra) { | |
|       iPredMode | AC(8) |
|     } else { | |
|       bIsIntraMix | 1 |
|       MbMode | AC(7) |
|     } | |
|   } | |
| } | |
| if (bSkip == 0) { | |
|   CBP | 6 × AC(2c) |
| } | |
| if (bIsIntra == 0) { | |
| if (NRefs == 2) { | |
|   RefNo | AC(2) |
|   } | |
| } | | wherein the macroblock header parameters are as follow:

bSkip—if 1, no motion or texture data transmitted, the pixel values are copied from the collocated macroblock on reference frame. Coded with 2-symbol adaptive AC model, initial statistics (1,1).

MvType—currently should be 0. Coded with 2-symbol adaptive AC model, initial statistics (1,1).

bIsintra—if 1, macroblock is intra-coded, otherwise inter-coded. Coded with 2-symbol adaptive AC model, initial statistics (1,1).

iPredMode—intra prediction mode index. Coded with 8-symbol adaptive AC model.

bIsIntraMix—currently should be 0.

MbMode—macroblock subdivision mode index. The macroblocks are numbered as in above FrameHeader.bSubdivModeEnable. Coded with 7-symbol adaptive AC model.

CBP—coded block pattern for 6 texture blocks (4 luma and 2 croma). The zeroed bit means that the corresponding block texture has all coefficients 0 and is not coded. Each bit of the pattern is coded with separate context-dependent two-state adaptive AC model, contexts are the number of raised bits preceding the one to be coded.

RefNo—the number of the reference frame. Value 0 or 1 means reference frame index, value 2 stands for bi-directional motion compensation (compensation from both frames). Coded with a 3-symbol adaptive AC model.

Macroblock Motion Data

Macroblock motion data is the motion vector differences for all macroblock subdivision blocks. There are two motion vectors per block when bi-directional motion compensation is used, otherwise there is one motion vector per block. Motion vectors are coded as (x,y) pairs in normal block order (first the motion vectors for block 0, then for block 1, etc.). The motion vector difference is the difference from the predicted motion vector, in half-pel resolution.

Motion Vector Prediction

For motion vector prediction we use standard MPEG-2 median prediction that is X=max(a,min(b,c)), where a, b and c are the appropriate motion vector component of left, upper and upper-right neighboring blocks (see below).

|   | b | c |
|---|---|---|
| a | X |   |

Special cases are treated as follows:

If one of the neighboring blocks does not exist, the motion vector for that block is substituted with (0,0).

If there is only one neighboring block to predict from, the predicted motion vector is the motion vector of that block.

If none of the neighboring blocks is present, the predicted motion vector is (0,0).

If the neighboring block is "skipped", we consider it to have zero motion vector.

Motion Vector Difference Coding.

In the present method, the x and y components of the motion vector difference are coded independently, with x component being coded first. We code, with adaptive AC model the most significant bit number of the vector component absolute value (counting from 1). For zero, we code zero. If the value is positive, we code the sign again with adaptive AC model. Then we pass the value (abs(x)−1) through the AC encoder, with the most significant bit (=1) discarded.

TABLE 7

| Vector component | |
|---|---|
| Magnitude | AC(17) |
| if (Magnitude > 0) { | |
|    Sign | AC(2) |
|    abs(x)−1 | Magnitude−1 |
| } | | wherein the vector component parameters are:

Magnitude—0, or number of bits necessary for binary representation of absolute value;

Sign—sign of the value to be coded.

Macroblock Texture Data

The macroblock is divided into four 8×8 blocks. First, the luma blocks is encoded for which the coded block pattern bit is raised, then encoding is provided for the four 4×4 U-blocks and then for the four 4×4 V-blocks. The 2D-DCT transform is performed on texture difference blocks that are the texture difference from the prediction either intra- or inter-). The transform coefficients are quantized and then coded into the bitstream.

3-D Mode Encoding

To describe the 3D-mode encoding, let's divide the sequence of video frames into the groups of 8 sequential frames and call each of these groups a 3-dimensional frame, or a 3D-frame. In the case of encoding of 3-dimensional frame (3D-Frame), the frame is divided into 16×16×8 3 D-macroblocks (16×16 in spatial dimensions and 8 in the time axis, which is considered to be the third coordinate). The 3D-frame common information is coded in a 3D-frame header that is an equivalent to a frame header. Each macroblock is subject of 3D-DCT transform, with coefficients of that transform coded to the bitstream. First, the DCT-transform is made in the time axis, which results in 8 2D-planes of DCT coefficients that can be combined in a 3D-matrix again. A group of 8 frames is divided into 8×8×8 3D-blocks that are converted into frequency domain with a 3D-DCT, or a combined DCT/wavelet transform. If a wavelet mode is in use, the DC-plane is coded with a wavelet encoder as an ordinary intra-frame and other planes are transformed with the 2D-DCT. The 3D-macroblocks are coded row-by-row, left-to-right (See Tables 9 and 10).

TABLE 9

| 3D_frame |
|---|
| 3D_frame_header |
| if (IG_header.b_UseWavelets) { |
|    DC_plane |
| } |
| 3D_DCT_coeffs |

TABLE 10

| 3D_frame_header | |
|---|---|
| StartCode | 24 |
| StartCodeValue | 8 |
| Time | 8 |
| QuantStep | 5 |
| bComplete | 1 |
| If (!bComplete) { | |
|    NFrames | 3 |
| } | | wherein the header parameters are as follow:

Time—is the display time of the frame in the independent group;

QuantStep—is quantization parameter;

bComplete—if 1, all 8 frames are present in the 3D-frame, otherwise number of frames coded is specified by the parameter nFrames;

nFrames—is the number of frames in 3D-frame.

A 3D-macroblock is coded as 7 or 8 successive 2D 16×16 DCT macroblocks (depending on whether the temporal DC plane was coded with wavelet coder or not). Each of the 8×8 block of DCT coefficients is coded as a texture difference block, with different arithmetic models used for different temporal frequency layers. No header is used for a 3D-macroblock and the macroblock data contains only the DCT transform coefficients. The coefficients of this transform are reordered and run-length coded, then coded arithmetically with context-dependent models. The 3D-coding reduces the temporal redundancy in the video sequence. The low-frequency plains are the most informative, with DC-plane containing about 80% of the group information. The more accurate coding of the low-frequency planes, and especially the DC-plane results in a better visual quality at the cost of only a slight loss in speed and/or bitrate.

Preferred Embodiment

The encoding method of the preferred embodiment comprises following steps:
1. wavelet transform/inverse transform and quantization of two-dimensional data using Daubechies 9/7 wavelet and uniform scalar quantization algorithms;
2. deblocking;
3. context modeling and entropy coding of wavelet transform coefficients;
4. internal bilinear downscaling using bilinear interpolation;
5. motion estimation;
6. texture intra prediction;
7. calculating texture prediction error, discrete cosine transform and inverse discrete cosine transform (DCT and IDCT) and quantization of DCT coefficients;
8. selecting the best parameters and modes for macroblock coding;
9. arithmetic encoding;
10. context modeling and entropy coding of macroblock subdivision mode and texture coded block pattern;
11. context modeling and entropy coding of texture prediction error DCT coefficients;
12. calculating prediction of motion vector components;
13. context modeling and entropy coding of motion vector prediction error differences;
14. controlling rate;
15. controlling CPU load using combined encoding in accordance with platform characteristics and initial codec settings; and
16. noise reduction.

At first, the frame to be coded may be downscaled into ¾ or ½ of it's original size (step 4) to make the encoding process faster, if this encoding option has been set. Then, after the optional downscaling and before the encoding a noise reduction procedure (step 16) may be applied. Before the encoding itself the motion estimation procedure (step 5) for the current frame is performed using the previously reconstructed frames. If the wavelet coding is used, the following consequent procedures are performed:
  wavelet transform, quantization of the wavelet coefficients (step 1),
  arithmetic coding of the wavelet coefficients using the corresponding arithmetic context models (step 3),
  inverse coefficients quantization and inverse wavelet transform for the frame texture reconstruction.

If the wavelet coding is not used, the frame coding is performed as follows. Each video frame is divided into blocks of pixels and the block pixels are predicted using the reconstructed texture of previously coded/decoded frames and specifying the blocks motion vectors ("inter" prediction), or using the reconstructed texture of previously coded/decoded blocks of the current frame and specifying prediction method ("intra" prediction (step 6)). After choosing the best coding parameters (step 8) texture prediction error blocks are transformed and the transform coefficients quantization is performed (step 7). If "inter" prediction method was chosen for block encoding then the predictions for motion vector components and motion vectors prediction differences are calculated (step 12). All the macroblock parameters are coded arithmetically (step 9) with separate arithmetic context models for:
  texture prediction error transform coefficients (step 11),
  motion vectors prediction differences (step 13).
  auxiliary macroblock parameters—the mode of macroblock subdivision into motion compensated blocks, intra prediction modes (if any) and texture coded block pattern indicating 8×8 blocks, which have no nonzero quantized coefficients.

The decoding is performed by applying to the bitstream the transformations inverse to the described above—the arithmetic decoding is provided by using the described arithmetic models, the motion vectors reconstruction is done by using their predictions and prediction error differences and, finally, the frame pixels reconstruction by using the motion vectors, the previously reconstructed texture, and the texture prediction error obtained by the inverse quantization and inverse transform of the decoded transform coefficients. After the frame pixels reconstruction is done, the deblocking procedure for the frame (step 2) and bilinear frame upscaling (if needed) are performed.

At the end of the frame encoding procedure the decoding steps above (except arithmetic decoding and optional bilinear frame upscaling) are performed in the encoder as well to obtain the reconstructed frame for further use as a reference for motion estimation.

The encoding process settings like the quantization parameter, the admissible motion compensated blocks sizes, etc. for each frame are controlled by the rate control unit (step 14) and CPU controlling unit (step 15).

The following are the algorithms used in the proposed encoding method.

Matched Scaling Algorithm (Factor 0.75)

To accelerate the encoding/decoding a special technique called matched scaling is used in the present application. It is actually a combination of matched pre- and postprocessing. The downscaling is used before the encoding of the video frame; then, after decoding, in order to restore the original size of the frame with minimal waste of quality, the upscaling of the frame is used.

The factor of re-scaling in the preferred embodiment is 0.75. This means each block of size 4×4 after downscaling becomes of size 3×3 and then after upscaling it is again 4×4. The block resizing is done as a superposition of two identical passes: horizontal and vertical. During the horizontal/vertical downscaling each line/column X of size 1×4/4×1 becomes line/column Y of size 1×3/3×1 according to following formulas:

$Y[0]=X[0]$ $Y[1]=\frac{2}{3}*X[1]+\frac{1}{3}*X[2]$ $Y[2]=\frac{1}{3}*X[2]+\frac{2}{3}*X[3]$ During the horizontal/vertical upscaling each line/column X of size 1×3/3×1 becomes line/column Y of size 1×4/4×1 according to one of two variants of formulas:

when X[2] does not lie on frame right border in the case of line or on frame bottom border in the case of column (this condition guarantee knowledge of next X[3] value):

$Y[0]=X[0]$ $Y[1]=\frac{1}{8}*X[0]+\frac{7}{8}*X[1]-\frac{3}{8}*X[2]+\frac{1}{8}*X[3]$ $Y[2]=-\frac{1}{4}*X[0]+\frac{3}{4}*X[1]+\frac{3}{4}*X[2]-\frac{1}{4}*X[3]$ $Y[3]=\frac{1}{8}*X[0]-\frac{3}{8}*X[1]+\frac{7}{8}*X[2]+\frac{1}{8}*X[3]$ when either X[2] lie on frame right border in the case of line or on frame bottom border in the case of column (this means next X[3] value is unknown):

$$Y[0]=X[0]$$

$$Y[1]=\frac{1}{4}*X[0]+\frac{3}{4}*X[1]$$

$$Y[2]=-\frac{1}{2}*X[0]+\frac{3}{2}*X[1]$$

$$Y[3]=\frac{1}{4}*X[0]-\frac{3}{4}*X[1]+\frac{3}{2}*X[2]$$

In the present application for scaling an integer arithmetic calculation method is used, which is fast and precise enough. After the first horizontal resizing step the intermediate result is stored without limitations, which means that it can fall outside the interval [0, 255]. When the frame dimension is not divisible by 4, the right and bottom border areas can not be fully resized. In this case they are resized only in horizontal or in vertical direction; right bottom corner area is sometimes not resized at all.

Deblocking Algorithm

Deblocking is used for elimination of block effect from restored image encoded on the block bases at high distortion level. The actual purpose of the algorithm is smoothing near the block borders that results not only in better visual quality, but also in better peak signal-to-noise ratio (PSNR). Presented deblocking algorithm is a superposition of two identical deblocking passes: horizontal and vertical. First we smooth all vertical borders and after—all horizontal borders. Let consider a string/column (we call it sequence) of values in a video frame . . . , x[−N/2], x[−(N/2−1)], . . . , x[−1], x[0], . . . , x[N/2−2], x[N/2−1], . . . , where x[−1], x[0]— values of border points; N—size of block.

The next procedure is always applied two times for smoothing of such sequence:

if (abs(x[−2]−x[−1])<abs(x[−1]−x[0])), and (abs(x[0]−x[1])<abs(x[−1]−x[0])), and (abs(x[−1]−x[0])<T1), then:

tmp=x[−1]

x[−1]=(L(x[1], x[−1])+x[0]+x[−1]+x[−2]+2)>>2 x[0]=(L(x[−2], x[0])+tmp+x[0]+x[1]+2)>>2 x[i]=(L(x[i+2], x[i])+L(x[i+1], x[i])+x[i]+L(x[i−1], x[i])+2)>>2, wherein i=−2, −3, . . . , −(N/2−1)

x[i]=(L(x[i−2], x[i])+L(x[i−1], x[i])+x(I)+L(x[i+1], x[i])+2)>>2, wherein i=1, 2, . . . , N/2−2 where
  abs(x)—absolute value of x
  >>—right binary shift

L(x, y)=x, if abs(x−y)<T2, and L(x,y)=y, if abs(x−y) >=T2

T1=2*QP−16

T2=(QP+5)/4

QP—quant parameter.

It should be noted that the deblocking is applied only when quant parameter QP>10 and N must be an even number and greater than or equal to 4.

In order to speed-up the deblocking, the smoothing can be provided only in one direction, either horizontal or vertical.

Context Modeling and Entropy Coding of Wavelet Transform Coefficients

The context-based entropy coding of the wavelet transform coefficients is illustrated by FIG. 6. Three neighboring coefficients and one root coefficient were selected as contexts. The value of each coefficient is coded arithmetically via binary decisions. 64 binary adaptive contexts are used in this process. The context-based entropy coding of the first transform coefficient absolute value is provided as follows:
  1. Set the current (prospective) value of the coefficient=0;
  2. Construct the bits of context number for entropy-coded binary value:
    bit 0=abs(n1)>current value
    bit 1=abs(n2)>current value
    bit 2=abs(n3)>current value
    bit 3=(root coeff.=0)
    bits 4,5=(abs(n3)*3+abs(n1)*3+abs(n2)*2+4)/8={0, 1, 2, 3 or greater}
  3. Using the context, send "1" if abs(coefficient) is equal to the current value, otherwise send bit "0";
  4. Increment the current value;
  5. Repeat step 2 while abs(coefficient) is not equal to the current value. If absolute value of the coefficient is greater than 0, the sign is sent;

Four contexts were used in this process. The bits of the context number are:
  Bit 0=(n1>0)
  Bit 1=(n3>0).

Uniform Quantization

The uniform quantization is presented as follow:

$$q\_Coeff=round(Coeff/Quantizer),$$

wherein
  Coeff—wavelet transform coefficient;
  q_Coeff—quantized coefficient;
  Quantizer—quantization step size.

The corresponding de-quantization is:

Coeff={q_Coeff<0: q_Coeff*Quantizer−Quantizer/2
  q_Coeff=0: 0
  q_Coeff>0: q_Coeff*Quantizer+Quantizer/2

Motion Estimation

Figure 7:
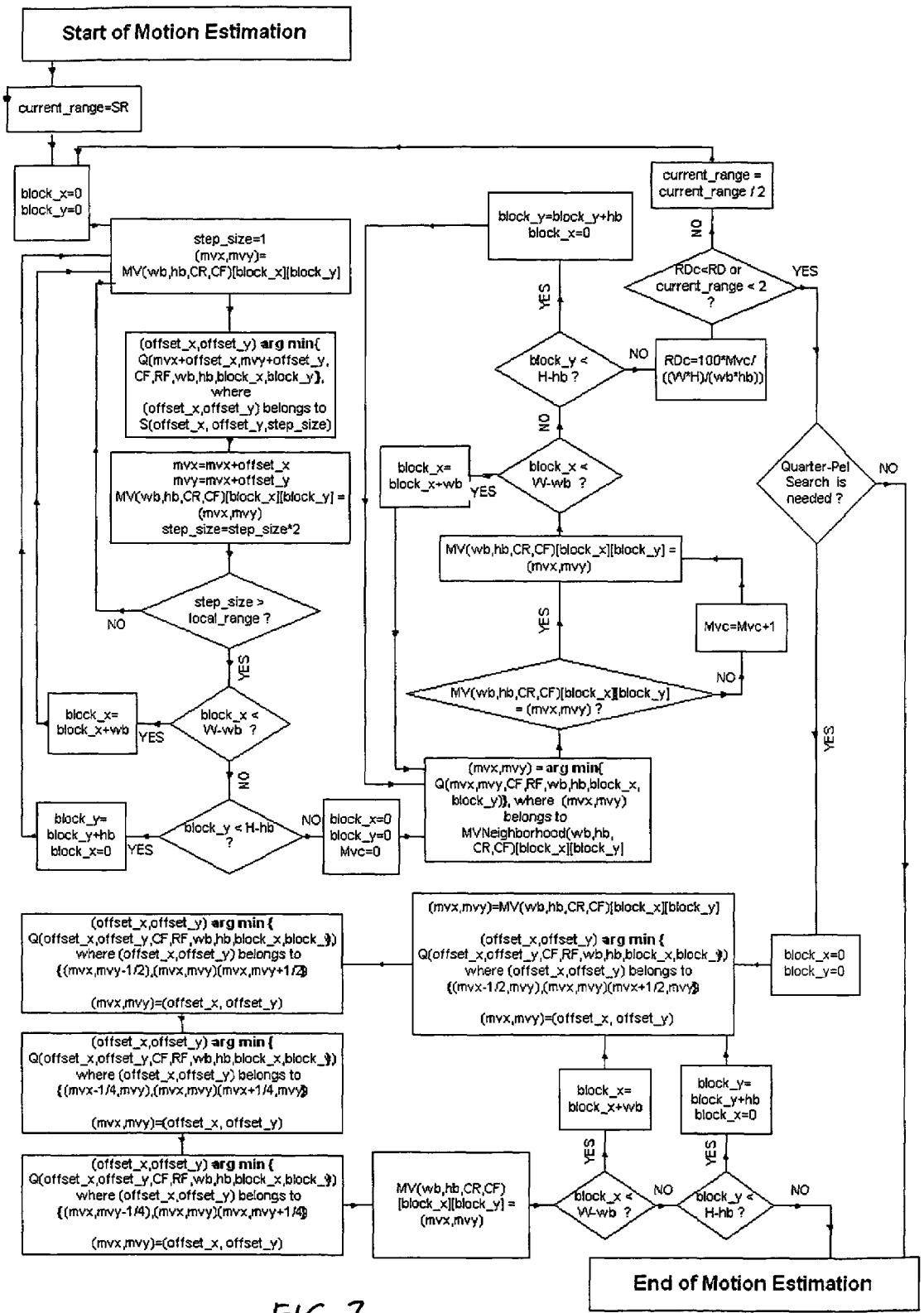
FIG. 7 is a block-diagram of the motion estimation algorithm.

The Motion Estimation algorithm is illustrated by FIG. 7. Let's introduce the following notations:
  CF—current frame;
  RF—reference frame;
  CF [x][y]—current frame pixel with horizontal coordinate x and vertical coordinate y;
  RF [x][y]—reference frame pixel with horizontal coordinate x and vertical coordinate y;
  SR—motion estimation search range;
  W—current and reference frame width;
  H—current and reference frame height;
  wb—width of the blocks for which motion estimation is performed;
  hb—height of the blocks for which motion estimation is performed;
  Q(mvx, mvy, CF, RF, wb, hb, block_x, block_y)—motion vector weight calculation function;
  MV(wb, hb, CF, RF)[block_x][block_y]—motion vector (i.e. pair (mvx,mvy) of integers) corresponding to the frame CF and reference frame RF for the block of width wb, height hb, which left-top corner is located at the pixel with horizontal coordinate block_x and vertical coordinate block_y;

MV(wb, hb, CF, RF)—a set of motion vectors MV(wb, hb, CF, RF)[block_x][block_y] for: block_x=0, wb, 2·wb, 3·wb, . . . , block_x<W and block_y=0, hb, 2·hb, 3·hb, . . . , block_y<H.

MVNeighborhood (wb, hb, CF, RF)[block_x][block_y]—a set of neighboring motion vectors MV(wb, hb, CF, RF)[nx][ny], where nx may be equal to block_x−wb, block_x, block_x+wb, and ny may be equal to block_y−hb, block_y, block_y+hb, and nx≧0, ny≧0, nx≦W−wb, ny≦H−hb;

$S(x_0, y_0, step)$—a 3-parametric set of motion vectors used as a pattern for inverse logarithmic search;

RD—the percentage of the refinement depth used in the Inverse Logarithmic Search (see below).

It's supposed that W is a multiple of wb and H is a multiple of hb.

The current encoding algorithm as well as many other encoders like ITU-T H.264 can use motion vectors with quarter-pel accuracy. This means that the components of the motion vectors are of the form N/4, where N is an integer. Of course in this case it should be a possibility to get the value of frame pixel with quarter-pel accuracy coordinates. In the proposed coding algorithm a simple bilinear interpolation is used for this purpose, but the described motion estimation algorithm doesn't assume any restrictions for the quarter-pel interpolation method, it may be applied also to ITU-T H.264 encoders with same good results. To exploit the advantages of this feature a fast and effective quarter-pel motion estimation algorithm may be created as well.

Below is the description of the Integer-Pel Motion Estimation procedure for calculation of integer motion vectors, Quarter-Pel Motion Estimation procedure for calculation of motion vectors with quarter-pel accuracy on the base of Integer-Pel Motion Estimation procedure results. There are also two auxiliary procedures Inverse Logarithmic Motion Search and Motion Vector Refinement. Together with Quarter-Pel Motion Estimation procedure they use all the input parameters of the Integer Motion Estimation and some specific additional parameters indicated in their descriptions. The final motion vectors MV (wb, hb, CF, RF) with quarter-pel accuracy are calculated by sequential applying of Integer-Pel Motion Estimation and Quarter-Pel Motion Estimation procedures.

Integer-Pel Motion Estimation (IPME)

The current algorithm requires MV(wb, hb, CF, RF) as a base for the motion search. Before beginning the procedure the values of the motion vectors from MV(wb, hb, CF, RF) may be filled in by the values of the motion vectors for collocated blocks of the larger size if they were calculated earlier, or by motion data defined by global motion estimation (if any). For example, the motion vectors for the blocks of size 16×16 may be used as a base for vectors of blocks 16×8 and 8×16, and motion vectors for the blocks of size 8×8 may be used as a base for vectors of blocks 8×4, 4×8 and 4×4. In this case the motion estimation may be considered as a detailization of the previously calculated motion data. In the default case all the motion vectors from MV(wb, hb, CF, RF) are set to zero before the motion estimation procedure.

Input:
CF, RF, SR, W, H, H, wb, hb, Q(mvx, mvy, CF, RF, wb, hb, block_x, block_y),
$S(x_0, y_0, step)$, MV(wb, hb, CF, RF).

Output:
MV(wb,hb, CF, RF).

The IPME algorithm description is as follows:
Set current_range=SR.
Step 1.
Set block_x=0, block_y=0.

Step 2.
Perform Inverse Logarithmic Motion Search with parameters:

--- block_x, block_y, current_range.
If block_x< W−wb
{
    Set block_x=block_x+wb
    Go to the beginning of Step 2.
}
else
if block_y<H−hb
{
    Set block_x=0,
    Set block_y=block_y+hb,
    Go to the beginning of Step 2.
}
else
{
    Go to Step 3.
}

---

Step 3.
Perform Motion Vectors Refinement. If the output value of the Motion Vectors Refinement does not exceed RD or current_range<2, then end the Integer-Pel Motion Estimation Procedure, else set current-range=current-range/2, and go to the Step 1.

Inverse Logarithmic Search (ILS)
Input:
block_x, block_y, local_range.
Output:
MV(wb, hb, CF, RF)[block_x][block_y].
Following is the ILS algorithm description:
Set step_size=1, (mvx,mvy)=MV(wb, hb, CF, RF)[block_x][block_y].
Step 1.
Choose from the set S (offset_x, offset_y, step_size) an element (offset_x, offset_y), that provides the minimal value of the function:
    Q(mvx+offset_x, mvy+offset_y, CF, RF, wb, hb, block_x, block_y).
Step 2.
Set mvx=mvx+offset_x, mvy+offset_y, MV(wb, hb, CF, RF)[block_x][block_y]=(mvx, mvy), step_size=2 step_size.
If step_size<=local_range, then—go to Step 1, else end of Inverse Logarithmic Search.

Motion Vectors Refinement (MVR)
Input:
No specific input parameters.
Output:
Percentage of the motion vectors from MV(wb, hb, CF, RF) changed inside the procedure.
MVR Algorithm Description:
Set block_x=0, block_y=0, Mvc=0.
Step 1.
Choose from MVNeighborhood (wb, hb, CF, RF)[block_x][block_y] the element (mvx, mvy) that provides the minimal value of the function
    Q(mvx,mvy,CF,RF,wb,hb,block_x,block_y).

---

If MV(wb, hb, CF, RF)[block_x][block_y] ≠ (mvx, mvy), set Mvc=Mvc+1.
Set MV(wb, hb, CF, RF)[block_x][block_y] = (mvx, mvy).
If  block_x < W−wb,
{

-continued

```
    Set    block_x = block_x+wb,
    Go to the beginning of Step 1,
}
else
if block_y < H-hb,
{
    Set    block_x = 0,
    Set    block_y = block_y+hb,
    Go to the beginning of Step 1,
}
else
{
    Output value equals to 100·Mvc/((W·H)/(wb·hb)),
where Mvc is a number of motion vectors changed during one refinement
procedure. Mvc = 0 at the beginning of the procedure and is being
incremented every time when some motion vector for the frame is being
changed.
    End of the Refinement procedure.
}
```

Motion vector weight calculation function Q(mvx, mvy, CF, RF, wb, hb, block_x, block_y) is expected to monotonically increase with respect to the number of bits needed to encode the texture prediction error and the motion vector for this motion compensated block. As a rule, for the most of coding algorithms, the function:

H(wb, hb, CF, RF, block_x, block_y, mvx, mvy)+λ·
(log$_2$(α+|mvx_diff|)++(log$_2$(α+|mvy_diff|))

may be successfully used for this purpose, wherein the values of λ and α are chosen based on the coding conditions. In frames of the current algorithm the following values are preferred: α=10 and λ=32, which provide good results. It's also worthwhile to make them dependent on the quantization parameter used. For the encoding in frames of ITU-T H.264 algorithm, the appropriate values for these parameters may be also successfully found. The function H(wb, hb, CF, RF, block_x, block_y, mvx, mvy) denotes the sum of the absolute values of two-dimensional discrete Hadamard transform for the block texture prediction error (See e.g. Pratt, W. K., Kane, J. and Andrews, H. C., "Hadamard Transform Image Coding," *Proc IEEE*, January 1969, Vol 57, No 1, pp. 58-68 for Hadamard transform description.).

The values mvx_diff and mvy_difare the calculated as:

mvx_diff=mvx−median (Ax,Bx, Cx), mvy_diff=mvy−median (Ay,By, Cy), wherein median (x, y, z) means the median value of the values of x, y, z;

(Ax, Ay) is equal to MV(wb, hb, CF, RF)[block-x−wb][block_y], if block_x>=wb, and (Ax, Ay) is equal to (mvx, mvy), if block_x<wb, (Bx, By) is equal to MV(wb, hb, CF, RF)[block-x][block_y−hb], if block_y>=hb, and (Bx, By) is equal to (mvx, mvy), if block_y<hb, (Cx, Cy) is equal to MV(wb, hb, CF, RF)[block_x+wb][block_y−hb], if block_y>=hb, block_x<=W−wb, and (Cx, Cy) is equal to (mvx, mvy), if block_y<hb, or block_x>W−wb.

In frames of the proposed algorithm the following possible three-parametric sets S(x$_0$, y$_0$, step) of motion vectors are used as a pattern for the inverse logarithmic search:

S$_1$(x$_0$, y$_0$, step)={(x$_0$−step, y$_0$), (x$_0$+step, y$_0$), (x$_0$, y$_0$−step), (x$_0$, y$_0$−step)}, S$_2$(x$_0$, y$_0$, step)={(x$_0$−step, y$_0$−step), (x$_0$−step, y$_0$+step), (x$_0$+step, y$_0$+step), (x$_0$+step, y$_0$−step)}, S$_3$(x$_0$, y$_0$, step)=S$_1$(x$_0$, y$_0$, step)∪S$_2$(x$_0$, y$_0$, step).

It could be noticed that the described motion estimation algorithm may be implemented avoiding multiple calculations of Q(mvx, mvy, CF, RF, wb, hb, block_x, block_y) with the same set of arguments. It's just needed to store in memory the corresponding already calculated values.

Quarter-Pel Motion Estimation

Let's reformulate the task as follows. Given the integer-pel accuracy motion vector MV(wb, hb, CF, RF)[block_x][block_y], we need to find this motion vector with quarter-pel accuracy by changing its components in range [−¾; +¾] with a step ¼. It is also assumed that Q(mvx, mvy, CF, RF, wb, hb, block_x, block_y) can deal with quarter-pel accuracy motion vectors.

Input:
MV (wb, hb, CF, RF)
Output:
MV (wb, hb, CF, RF)
Algorithm Description:
Set block_y=0, block_y=0.

Step 1.
Set (mvx, mvy)=MV(wb, hb, CF, RF)[block_x][block_y].

Step 2.
Choose from the set of pairs {(mvx−½, mvy); (mvx, mvy); (mvx+½, mvy)} such element (offset_x, offset_y) that provides the minimal value of the function Q(offset_x, offset_y, CF, RF, wb, hb, block_y, block_y). Set mvx=offset_x, mvy=offset_y.

Step 3.
Choose from the set of pairs {(mvx, mvy−½); (mvx, mvy); (mvx, mvy+½)} such element (offset_x, offset_y) that provides the minimal value of the function Q(offset_x, offset_y, CF, RF, wb, hb, block_y, blocky). Set mvx=offset_x, mvy=offset_y.

Step 4.
Choose from the set of pairs {(mvx−¼, mvy); (mvx, mvy); (mvx+¼, mvy)} such element (offset_x$_1$ offset_y) that provides the minimal value of the function Q(offset_x, offset_y, CF, RF, wb, hb, block_y, block_y). Set mvx=offset_x, mvy=offset_y.

Step 5.
Choose from the set of pairs {(mvx, mvy−¼); (mvx, mvy); (mvx, mvy+¼)} such element (offset_x, offset_y) that provides the minimal value of the function Q(offset_x, offset_y, CF, RF, wb, hb, block_y, block_y). Set mvx=offset_x, mvy=offset_y.

Step 6.
Set MV(wb, hb, CF, RF)[block_x][block_y]=(mvx, mvy).

Step 7

```
    If block_y < W − wb,
    {
        Set block_x=block_x+wb,
        Go to the Step 1.
    }
    else
    if block_y < H − hb,
    {
        Set block_y = 0
        Set block_y = block_y +hb
        Go to the Step 1
    }
    else
    {
        End of the Quarter-Pel Motion Estimation procedure.
    }
```

Texture Prediction for Intra Macroblocks

For prediction of block pixel values, one of 8 intra-prediction modes can be used, as coded in the macroblock header.

0: pixels are copied from the rightmost column of the left neighboring block $x_{i,j} = x_{-1,j}$ 1: pixels are copied from the bottom row of the above neighboring block $x_{i,j} = x_{i,-j}$ 2: pixels of blocks 1 and 4 are predicted as in mode 3, pixels of block 2 are predicted vertically (mode 1), pixels of block 3 are predicted horizontally (mode 0):

$x_{i,j} = (x_{-1,j} + x_{i,-j} + 1)/2$ if $((i < 8 \,\&\&\, j < 8)\|(i >= 8 \,\&\&\, j >= 8))$ $x_{i,j} = x_{-1,j}$ if $(i < 8 \,\&\&\, j >= 8)$ $x_{i,j} = x_{i,-j}$ if $(i >= 8 \,\&\&\, j < 8)$

3: pixels are average of prediction modes 0 and 1:
$x_{i,j} = (x_{-1,j} + x_{i,-j} + 1)/2$ 4: all macroblock pixels are average of on upper and left boundary of the macroblock:

$$x_{i,j} = \sum_{0 \le k \le 8} (x_{-1,k} + x_{k,-1})$$

5: vertical prediction is used for blocks 1 and 2, and horizontal prediction is used for blocks 3 and 4:

$x_{i,j} = x_{-1,j}$ if $(i >= 8)$ $x_{i,j} = x_{i,-j}$ if $(i < 8)$

6: vertical prediction is used for blocks 2 and 4, and horizontal prediction is used for blocks 1 and 3:

$x_{i,j} = x_{-1,j}$ if $(j < 8)$ $x_{i,j} = x_{i,-j}$ if $(j >= 8)$

7: the predicted pixel value is a weighted sum of horizontal and vertical predictions, where the weights are the distance from the left and the upper macroblock boundaries, respectively.

$$x_{i,j} = \left((16 - I)x_{-1,j} + (16 - j)x_{i,-1} + \frac{s}{2}\right)/s, \text{ where } s = 32 - i - j.$$

Texture Prediction for Inter Macroblocks

For inter-coded macroblocks the predicted block texture is the one from the motion compensation source block. The source block is a block in the reference frame dislodged from the current block by the motion vector. If the motion vector has rational coordinates, the pixel values are bilinear-interpolated. For bi-directional motion compensation, the predicted pixel values from two reference frames are averaged.

Texture Prediction Error Transform and Quantization

The transform used in the present method is a standard 2D-DCT transform as in MPEG-2, where all DCT-transform coefficients are quantized equally. Quantization is implemented in a manner that helps to avoid division.

For a given quantization parameter index QP the quantization process is performed as follows:

$$q = (c \cdot A(QuantStep) + \text{round}\_{const})/2^{20},$$

where
c=coefficient value;
q=quantized coefficient value;
A—is a constant depending on QP index; the codec uses a pre-defined table providing the correspondence between QP index values and A values.
round_const—is rounding control:
0.5*sign (c), if $|c| < 20 \cdot 2^{20}/A$ (QuantStep), and
0.25*sign (c), if otherwise.

The dequantization process has two steps: first, quantized coefficient values are multiplied by $2^{20}$ to reduce rounding error in inverse transform, second, the pixel values after inverse transform are subject to perform dequantization as follows:

$$p = (q \cdot B(QuantStep) + 2^{19})/2^{20}$$

where p=pixel value; q=quantized pixel value; B—is a constant depending on QP index.

The codec uses a pre-defined table providing the correspondence between QP index values and A values.

Coding of DCT Coefficients

Figure 5:
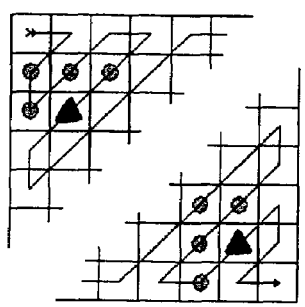
FIG. 5 shows encoding of transform coefficients.
Figure 4:
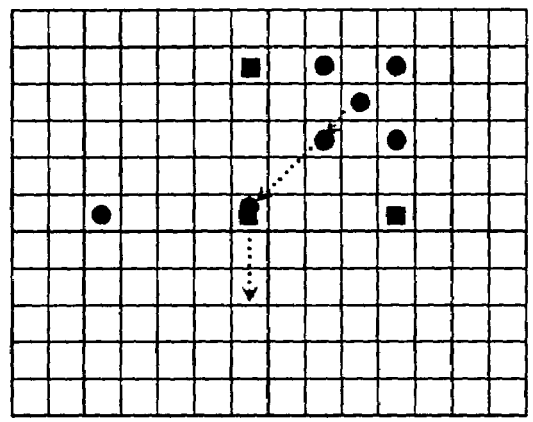
FIG. 4 shows an example of possible search path with searchRange=8.

For coding of transform coefficients we use arithmetic coding based on two-dimensional context/position-dependent modeling. The coefficients are encoded in a standard zigzag order and for the last non-zero coefficient a special symbol is encoded to indicate that no farther decoding is needed, thus gaining speed and compression efficiency. FIG. 5 shows encoding of transform coefficients. In order that compression technique can be use effectively, a zig-zag scan may be applied over the DCT coefficient. The zig-zag scan philosophy is to trace the nonzero coefficients according to their likelihood of appearance to achieve an efficient entropy coding. For encoding of the transform coefficients an arithmetic encoding method is used, which is based on a two-dimensional context/position-dependent modeling. The technique provides extremely high compression efficiency and real-time performance. The coefficients are encoded in standard zigzag order. The encoding may comprise up to two main stages, so that coefficient is encoded either only at the first stage, or (if it can not be fully processed at the first stage) at both stages. Regarding the coefficient value (v) there are three possibilities:

C0: v=0;
C1: abs(v)=1 (i.e. v=−1 or v=+1); and
C2: abs(v)>1 (all values, except 0, −1, +1), wherein "abs(v)" is the absolute value of v. In addition, the first possibility may be divided into two, subject to the values of the transform coefficients that follow the current coefficient in zigzag order:

C0a: v=0 and at least one of the values of subsequent coefficients is not equal zero;
C0b: v=0 and all subsequent coefficients have zero values.

Thus, we consider four possible cases: C0a, C0b, C1, C2. Every coefficient in the block can be uniquely ascribed to one of these cases. The case identifier (C0a, C0b, C1 or C2) is encoded at the first stage. Actually, the encoding is provided for the identifier numbers: 0 (C0a), 1 (C0b), 2 (C1) and 3 (C2). In the situation of C0a or C0b, no further coefficient processing is needed, because of the zero coefficient (v=0). Furthermore, in case of C0b we assume that not only this coefficient, but also all others in zigzag order are zero coefficients (i.e. coefficients that follow current one in zigzag order do not need encoding).

In order to complete the processing of the coefficient in case C1, its sign also must be encoded, because the coefficient value can be either −1 or +1. The encoding of the sign is based on the elementary uniform binary model. This means one bit should indicate whether the coefficient is positive (non-zero bit) or negative (zero bit).

The most complicated case is, of course, C2. Here not only the sign is encoded, which is encoded in the same manner as in the previous case, but also the absolute residual part of the coefficient value: abs(v)−1. It is done at the second encoding stage.

In case C2 each coefficient by its absolute value belongs to one of the following intervals: [2, 2], [3, 3], [4, 4], [5, 5], [6, 6], [7, 7], [8, 8], [9, 9], [10, 11], [12, 15], [16, 23], [24, 39], [40, 71], [72, 135], [136, 263], [264, 519], [520, 1031], [1032, 2055]. The encoding of the residual part is implemented as follows: at first the interval (actually its number) is encoded, and then, if necessary, the location of the absolute value of the coefficient in this interval using coding based on the elementary uniform model with alphabet size equal to the power of 2. All interval lengths are powers of 2, so we just write several bits. The bit lengths corresponding to represented intervals are 0, 0, 0, 0, 0, 0, 0, 0, 2, 3, 4, 5, 6, 7, 8, 9, 10. For example, if coefficient is encoded with value v=−30, we first encode identifier of C2 case-3, then we encode sign "-" as zero bit, after that we encode the number of interval [24, 39]-11 and finally we write the number 6 using 4 bits (6=30−24). It is important, that most often the corresponding interval contains only one value, hence the interval automatically provides the value.

At the first stage we use so-called primary modeling and at the second, so-called secondary modeling. Each primary model contains appearance frequencies of case identifiers, while each secondary model contains appearance frequencies of value intervals. These frequencies are used as input parameters for arithmetic encoding. The models are updated by increasing the appearance frequency counter of a certain identifier/value interval immediately after processing of this identifier/interval. To avoid the overflow and to increase the model adaptivity, the counters values are downscaled (factor ½), when the sum of all frequencies in a model (so-called total frequency) exceeds given threshold.

The primary and secondary models are stored in two arrays. The array of primary models is indexed by coefficient contexts and positions of coefficients in the block (i.e. for each context at each position there is one primary model). The array of secondary models is indexed only by positions (i.e. for each position there is one secondary model). The coefficient context is formed as a combination of four binary values (i.e. 16 possible contexts). Each binary value describes the zero property of coefficient (whether its value is equal to zero or not) surrounding the current one in two-dimensional block of transform coefficients. Four binary values always correspond to four already processed neighboring coefficients—on the left to current, on the left-top to current, on the top to current and on the right-top/left-bottom to current (the last one may change according to local zigzag orientation). If any of these four coefficients located beyond the block area, it is assumed to be a zero coefficient and the corresponding binary value is 0.

A significant gain in efficiency of the encoding comes from setting the initial statistics and model resealing parameters. They are thoroughly selected in order to get maximal results on most video sequences. The statistics initialization also helps to take into account the important property of C0b case: it can not appear right after a C0a case (otherwise, the previous C0a case would actually be the C0b case). We take this property into consideration in the following way: the statistical model, associated with context including zero binary value that is located at a position preceding the current position, is initialized so that C0b case is simply excluded from model statistics.

Range encoding method may be used for code generation and carry truncation. Range encoding is a fast arithmetic encoding with byte-oriented renormalization, which is described by G. N. N. Martin "Range encoding: an algorithm for removing redundancy from a digitized message, IBM UK Scientific Center"; M. Schindler "A Fast renormalization for Arithmetic Coding", Proc. Data Compression Conference, March 30-Apr. 1, 1998, Snowbird, Utah, USA; and implemented by D. Subbotin in his "Range Coding Proposal", 1999, which appeared as a news-group message in several news-groups (dedicated to compression technologies) and is well known to specialists who work in the area of data compression. Subbotin's implementation is a refusal to carry over. When a final interval becomes too short for further processing and it is impossible to output several most significant digits (i.e. to do the renormalization), the interval is simply truncated at the boundary of a power of 2 in order to perform the renormalization step. This hurts the efficiency of course, but the loss is very negligible (1 bit per 256 output bytes that is only 0.05%). The interval truncation is a very effective way of arithmetic encoder implementation. One of the advantages of such approach is coding-decoding symmetry: decoder is implemented using completely the same scheme.

Motion Vector Difference Encoding

For encoding of motion vector difference, a context-free arithmetic encoding is used, which is based on elementary sign-magnitude model. The absolute value of the difference belongs to one of the intervals:

[0, 0], [1, 1], [2, 3], [4, 7], . . . , [$2^n$, $2^{(n+1)}-1$]

First, the interval number is encoded; then, if difference is non-zero, the sign number is encoded (0 means "-", 1 means "+") and position of the difference in the interval.

A simple context-free arithmetic model is used for encoding of intervals and for sign encoding. The model contains the appearance frequencies of interval/sign numbers. These frequencies are used as input parameters for arithmetic encoding. The models are updated by increasing the appearance frequency counter of a certain interval/sign immediately after processing of this interval/sign. To avoid an overflow and to increase the model adaptivity, the values of the counters are downscaled with a factor ½ when the total frequency (the sum of all frequencies in the model) exceeds a predetermined threshold. The updated parameters may be preset in order to get maximal efficiency on most video sequences. To encode a position of difference in the interval we use an elementary uniform model with alphabet size equal to the $2^n$ (i.e. the position is written using n bits). For example, if the difference is −5, after encoding the interval [4, 7] and sign we write the position of 5 in [4, 7]-1 using 2 bits (1=5−4).

For code generation a fast arithmetic encoding with byte-oriented renormalization (so-called range encoding) and carry truncation is used.

Noise Suppression Algorithm

Application of noise suppression routine results in significant abatement of almost all kind of noises, especially noises of random nature. The algorithm can be applied for sequences consisting of two or more successive video frames. Every time two successive frames are taken as input data. The result of the noise suppression is the second frame of these two with a smaller noise level. In order to suppress noise in all sequence, the algorithm should be applied successively to every pair of successive frames: frames 1 and 2 are taken first, than—frames 2 and 3, and so on. It is important that the result of a previous noise suppression step should be used in the consequent calculations. The noise suppression on the first frame in the sequence is attained by application of the algorithm for the first two frames of video sequence in reverse order: 2 and 1.

Suppression routine works as follows. First, a block motion estimation is provided for two successive frames in order to find correspondence between different areas of these frames. In order to make it, the second frame is divided into blocks; and the motion estimation is applied for every block. After the motion estimation stage comes the averaging stage. If the absolute difference of the intensities (brightness/color) for every two pixels at the same position in the corresponding blocks belonging to the first and second frames does not exceed a given threshold called noise suppression level, the intensity of the pixel belonging to the second frame is replaced with a half-sum of these two intensities.

For better results the motion estimation should be precise enough, otherwise averaging can cause visible image distortion. The method of the present application employs a half-pixel motion vector search that provides acceptable level of quality. Determination of intensities of pixels with non-integer coordinates is based on bilinear interpolation.

Decoding

The decoding is performed by applying to the bitstream the transformations inverse to the described above: the arithmetic decoding using the described arithmetic models, reconstruction of motion vectors using their predictions and prediction error differences, and, finally, reconstruction of the frame pixels using the motion vectors, the previously reconstructed texture, and the texture prediction error obtained by the inverse quantization and inverse transform of the decoded transform coefficients.

In addition to the encoder part, the decoder part of the codec comprises
  internal bilinear upscaling unit correlated with bilinear downscaling;
  three-dimensional data inverse transform and dequantization unit;
  arithmetic decoder unit;
  arithmetic context-based macroblock subdivision mode and texture coded block pattern decoding unit;
  arithmetic context-based texture prediction error decoding unit;
  motion vectors prediction calculating unit; and
  arithmetic context-based motion vector arithmetic decoding unit.

The preceding description is intended to be illustrative of the principles of the invention, and it will be appreciated that numerous changes and modifications will occur to those skilled in the art, and it is intended in the appended claims to cover all those changes and modifications which fall within the true spirit and scope of the present invention.

What is claimed is:

1. A method of real-time encoding a digitized sequence of video frames using a codec with high compression efficiency, comprising steps of:
  dividing a video frame into macroblocks of pixels;
  performing texture prediction using reconstructed texture of previously encoded/decoded video data;
  performing a texture prediction error transform; and
  performing quantization and encoding of DCT transform coefficients;
wherein quantization of DCT transform coefficients is performed using the following formula:

$$q = (c \cdot A \text{ (Quantstep)} + \text{round\_const}) + \text{round\_const})/2^{20};$$

where c—coefficient value;
  q—quantized coefficient value;
  A—a constant depending on quantization parameter index;
  round_const—rounding control: 0.5 sign (c), if $|c| < 20 \cdot 2^{20}/A$ (Quantstep) and 0.25 sign (c), if $|c| \geq 20 \cdot 2^{20}/A$ (Quantstep).

2. The method of claim 1, comprising a step of downscaling before encoding of the video frame using bilinear interpolation.

3. The method of claim 1, comprising a step of controlling parameters of encoded frames.

4. The method of claim 1, comprising a step of controlling frame encoding time and CPU load.

5. The method of claim 1, comprising a step of selecting best parameters and encoding mode for macroblock coding based on preset coding parameters and codec working parameters.

6. The method of claim 1, comprising a step of noise suppression.

7. The method of claim 5, wherein the encoding mode is a low-complexity 3-dimensional data coding.

8. The method of claim 5, wherein the encoding mode is motion compensation.

9. The method of claim 8, wherein frame encoding starts with choosing a best prediction mode.

10. The method of claim 9, wherein the prediction mode is inter prediction mode predicting block pixels using reconstructed texture of previously coded/decoded frames and specifying block motion vectors.

11. The method of claim 9, wherein the prediction mode is intra prediction mode predicting block pixels using reconstructed texture of previously coded/decoded blocks of current frame and specifying prediction method.

12. The method of claim 11, comprising wavelet transform, wherein resulting wavelet transform coefficients are compressed by context-based entropy coding.

13. The method of claim 12, wherein uniform quantization with constant step size is applied to all wavelet transform coefficients.

14. A method of real-time encoding a digitized sequence of video frames using a codec with high compression efficiency, comprising steps of:
  dividing a video frame into macroblocks of pixels;
  performing texture prediction using reconstructed texture of previously encoded/decoded video data;
  selecting best parameters for macroblock encoding based on preset coding parameters and codec working parameters for macroblock coding;
  selecting intra prediction mode predicting block pixels using reconstructed texture of previously coded/decoded blocks of current frame and specifying prediction method;
  selecting motion compensation mode for macroblock encoding;
  performing a texture prediction error transform; and performing quantization and encoding DCT transform coefficients using wavelet transform,
wherein resulting wavelet transform coefficients are compressed by the context-based entropy coding is based on contexts including three neighboring coefficients and one root coefficient, the value of each coefficient being coded arithmetically, and the context-based entropy coding of absolute value of transform coefficients is determined in accordance with the following algorithm:
  set a current value of coefficient=0;
  construct bits of context for entropy-coded binary value:
    bit 0=abs(n1)>current value, where abs (n1) is absolute value of the first neighboring coefficient;
    bit 1=abs(n2)>current value, where abs (n2) is absolute value of the second neighboring coefficient;
    bit 2=abs(n3)>current value, where abs (n3) is absolute value of the third neighboring coefficient;
    bit 3=0 (root coefficient=0);
    bits 4,5=(abs(n3)*3+abs(n1)*3+abs(n2)*2+4)/8={0, 1, 2, 3 or greater};
  using the context, send bit "1" if abs(coefficient)=current value, otherwise send bit "0";
  increment the current value;
  if abs(coefficient)≠current value, repeat the construct step;
  if abs(coefficient)>0, sent a sign,
  wherein the bits of context number are: Bit 0=(n1>0); Bit 1=(n3>0).

15. A method of real-time encoding a digitized sequence of video frames using a codec with high compression efficiency, comprising steps of:
  dividing a video frame into macroblocks of pixels;
  performing texture prediction using reconstructed texture of previously encoded/decoded video data;
  selecting best parameters for macroblock encoding based on preset coding parameters and codec working parameters;
  selecting motion compensation mode for macroblock encoding;
  selecting inter prediction mode for frame encoding predicting block pixels using reconstructed texture of previously coded/decoded blocks of current frame and specifying prediction method,
  performing a texture prediction error transform;
  encoding DCT transform coefficients using wavelet transform,
  compressing resulting wavelet transform coefficients by context-based entropy coding, and
  applying an uniform quantization with constant step size to all wavelet transform coefficients;
  wherein the uniform quantization of transform coefficients is presented as follows:

$q\_Coeff = round\ (Coeff/Quantizer)$, wherein Coeff—wavelet transform coefficient;
    q_Coeff—quantized coefficient;
    Quantizer—quantization step size.

16. The method of claim 15, comprising step of motion estimation for calculating-components of motion vectors.

17. The method of claim 16, wherein the motion vectors are calculated with quarter-pel accuracy.

18. A method of real-time encoding a digitized sequence of video frames using a codec with high compression efficiency, comprising steps of:
  dividing a video frame into macroblocks of pixels;
  performing texture prediction error transform;
  selecting best parameters for macroblock coding based on preset coding parameters and codec working parameters;
  selecting motion compensation mode for encoding;
  performing a texture prediction error transform;
  performing quantization and encoding of DCT transform coefficients; and
  performing calculation of components of motion vectors using motion estimation, wherein the motion estimation comprises:
  calculating motion vectors MV(wb, hb, CF, RF) with integer-pel accuracy using previously calculated motion data;
  calculating motion vectors MV(wb, hb, CF, RF)[block_x][block_y]performing inverse logarithmic motion search with parameters block_x, block_y, current_range;
  performing motion vector refinement choosing from sets of neighboring motion vectors MVNeiborhood (wb, hb, CF, RF)[block_x][block_y]elements (mvx, mvy) that provide minimum value of motion vector weight function Q(mvx, mvy, CF, RF, wb, hb, block_x, block_y);
  performing motion vector estimation with quarter-pel accuracy based on results of motion vector estimation with integer-pel accuracy by changing components of the integer-pel accuracy motion vector MV(wb, hb, CF, RF) [block_x][block_y]in range [−¾;+¾] with a step ¼; and
  calculating motion vectors MV(wb, hb, CF, RF) with quarter-pel accuracy by sequentially applying the motion estimation steps with integer-pel accuracy and with quarter-pel accuracy, wherein CF—current frame with horizontal coordinate x and vertical coordinate y;
    RF—reference frame with horizontal coordinate x and vertical coordinate y;
    wb—width of the blocks for which motion estimation is performed;
    hb—height of the blocks for which motion estimation is performed;
    W—a multiple of wb, current and reference frame width;
    H—a multiple of hb, current and reference frame height;
    Q(mvx, mvy, CF, RF, wb, hb, block_x, block_y)—motion vector weight calculation function;
    MV(wb, hb, CF, RF)[block_x][block_y]—motion vector (i.e. pair (mvx,mvy) of integers) corresponding to the frame CF and reference frame RF for a block of width wb, height hb, which left-top corner is located at a pixel with horizontal coordinate block_x and vertical coordinate block_y;
    MV(wb, hb, CF, HF)— a set of motion vectors MV(wb, hb, CF, RF)[block_x][block_y] for: block_x=0, wb, 2·wb, 3·wb, . . . , block_x<W, and block_y=0, hb, 2·hb, 3·hb, . . . , block_y<H;
    MVNeighborhood (wb, hb, CF, RF)[bloc_y][block_y]— a set of neighboring motion vectors MV(wb, hb, CF, RF)[nx][ny], where nx may be equal to block_x—wb, block_x block_x+wb and ny may be equal to block_y−hb block_y, block_y+hb, and nx≧0, ny≧0, nx≦W−wb, ny≦H−hb.

19. The method of claim 16, comprising step of arithmetic encoding of motion vector prediction difference.

20. The method of claim 1, wherein encoding of DCT transform coefficients is performed by arithmetic coding based on two-dimensional contest/position-depending modeling.

21. A method of decoding of sequence of video frames encoded according to claim 13, comprising steps of:
   arithmetic decoding;
   decoding coded block pattern of macroblock mode and texture using arithmetic context-based modeling;
   decoding texture prediction error using arithmetic context-based modeling;
   calculating prediction for motion vectors; and
   decoding motion vectors using context-based arithmetic modeling.

22. The method of decoding of claim 21, comprising internal bilinear upscaling correlated with bilinear downscaling provided at the time of encoding.

23. The method of decoding of claim 21, wherein the texture prediction error is provided by inverse transform and dequantization correlated with corresponding encoding procedures.

24. The method of decoding of claim 21, comprising step of deblocking of decoded video frame using at least one of horizontal and vertical deblocking passes for smoothing of sequence of video frame border points.

* * * * *